May 17, 1966 J. M. GORDON 3,252,115

TUNING ARRANGEMENT

Filed April 8, 1963

JOHN M. GORDON
INVENTOR.

BY Gerold Siegel
AGENT

United States Patent Office 3,252,115

Patented May 17, 1966

3,252,115

TUNING ARRANGEMENT

John Marvin Gordon, Los Angeles, Calif., assignor, by mesne assignments, to TRW, Inc., a corporation of Ohio Filed Apr. 8, 1963, Ser. No. 271,163
5 Claims. (Cl. 333—83)

This invention relates generally to a tuning mechanism and more particularly to an improved arrangement for tuning microwave cavity devices.

In the prior art, tuning of microwave cavities has been accomplished by means of circular tuning slugs attached to threaded members for rotationally inserting or withdrawing the tuning slug from the cavity. In order to provide high efficiency, the tuning slugs are preferably goldplated to reduce any hysteresis loss. Since the tuning slug forms part of the microwave cavity, electrical contact between the slug and the walls of the cavity is usually provided in the form of frictionally engaging fingers which contact the slug as the slug rotates. In devices of this sort, the fingers have a tendency to gouge the rotating slug thereby generating grooves which increase the frictional resistance between the fingers and the slug thereby changing the cavity size and reducing the efficiency of the cavity.

In this invention, the defects of the prior art are eliminated by using a tuning slug that is polygonal in shape and preferably rectangular. The tuning slug is attached at one end to a threaded member which is arranged to cooperate with a rotatable member. The tuning slug is restrained from rotational movement and is permitted to be translated only. The rotatable member is restrained from being movably translated but is permitted to be rotatably moved. In the environment just described, rotation of the rotatable member therefore will result in the tuning slug being movably translated. In the preferred embodiment the means preventing rotational movement of the tuning slug contains a plurality of fingers for frictionally engaging the tuning slug as the slug is translated. Electrical contact with the slug is always maintained thereby providing a highly efficient tuning cavity. Since the fingers always contact and track the same portions of the tuning slug throughout the full movement of the slug, a highly efficient tuning cavity is assured for the full tuning range.

Figure 1:
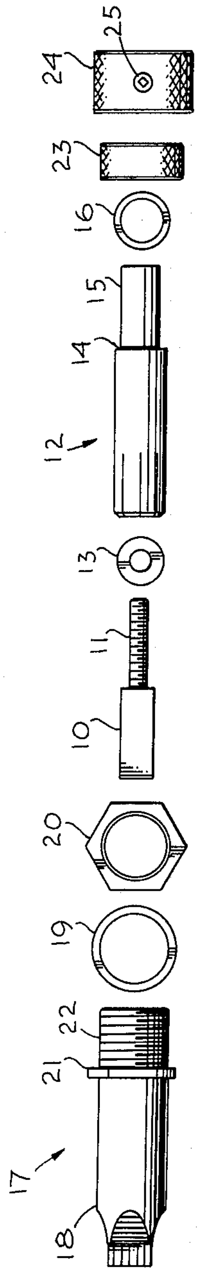
Figure 2:
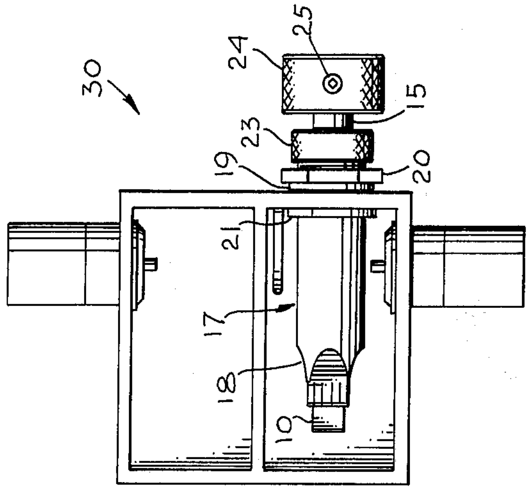

Further objects and advantages of this invention will be made more apparent by referring now to the accompanying drawings, wherein:

FIG. 1 is an exploded view illustrating the individual components comprising the invention; and FIG. 2 illustrates the invention completely assembled and located within a tuning cavity.

Referring now to FIG. 1, there is shown a tuning slug 10 having a substantially square cross-section and connected at one end to a threaded member 11. The threaded member 11 is arranged to be threadedly engaged within a rotatable member 12. In accordance with good engineering practice, a washer 13 is located between the slug 10 and the internally threaded portion of the rotatable member 12 when assembled. The rotatable member 12 is preferably constructed with a collar portion 14 thereby defining one end of the rotatable member 15 having a diameter that is less than the opposing end of the rotatable member 12 that is internally threaded. A compressionable washer 16 made of Teflon is placed over the smaller diametered end 15 of the rotatable member 12 and is caused to abut against the collar portion 14. The overall diameter of the washer 16 is made to approximate the outside diameter of the larger end of the rotatable member 12. The complete subassembly of the slug 10, threaded member 11, washer 13, rotatable member 12 and washer 16 is inserted into a main body 17. One end 18 of the main body 17 is formed rectangular in shape to approximate the form of the tuning slug 10 for the defined purpose of preventing the slug 10 from being rotated. In addition, the end portion 18 is segmented into a plurality of individual fingers for frictionally contacting the movable tuning slug 10. The washer 19 and lock nut 20 are used to secure the body member 17 to the walls of a suitable cavity as will be explained in connection with FIG. 2 by causing a shoulder 21 on the main body 17 to bear directly against the wall cavity. The washer 19 and lock nut 20 are located outside of the microwave cavity and are threaded against external threads 22 located on the opposing end of the main body 17. A cap member 23 having a diameter that is larger than the diameter of the end 15 of member 12 is caused to bear against the washer 16 which is bearing against the collar 14. In this position, the cap member 23 is threadedly engaged onto the threads 22 located on the main body 17. The cap member 23 serves a dual purpose of being an end plate for preventing translational movement of the rotatable member 12 and also as a lock for preventing rotational movement of member 12. The lock is available for positioning the tuning slug 10 as well as controlling the force necessary to adjust the tuning slug 10. The end portion 15 may be fitted with a slot for accepting a screw driver or a knurled control nut 24 may be inserted over the projecting end portion and locked thereto by means of a suitable set screw 25.

In operation, rotating the knurled control nut 24 rotates the rotatable member 12 which is restrained against translational movement but is allowed to rotate. The rotating member 12 which is internally threaded to the threaded member 11 will move the slug 10. However, since the slug 10 is prevented from moving rotationally by means of the end portions 18 in the main body 17 it can be appreciated that only a translational movement of the slug 10 can occur. The amount of control or movement of the tuning slug 10 will be a function of the length of the threaded member 11 and the depth of the internal threads in the rotatable member 12.

Referring now to FIG. 2, there is shown a microwave cavity 30 containing the assembled tuning device illustrated in FIG. 1. Rotating the knurled control nut 24 causes the tuning slug 10 to move into or out of the cavity depending only on the direction of rotation of the control nut. The amount of force necessary to effect the control is a function of the pressure exerted by the cap 23. Should less effort be required to effect a tuning operation, the cap 23 will be retarded. However, should a large degree of effort be required to effect control, the cap 23 will be tightened until the position of the rotatable member 12 and the slug 10 are effectively locked in place. It should be noted also that the locking operation effected by the cap 23 will not change the tuning position of the tuning slug 10 since the cap 23 is rotated to effect a locking condition and the tuning slug 10 is prevented from being rotationally moved.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein, except as defined by the appended claims.

The embodiments of the invention in which an exclusive property or privilege is claimed are defined as follows:

1. In combination, a microwave tuning cavity,
a tuning slug inserted within said microwave cavity and having a shape defining a polygon and adapted for translational movement,
a threaded member attached to one side of said slug,
a rotatable member cooperating with said threaded member and restrained against translational movement,
means for restraining said slug from rotational movement only, and
means for rotating said rotatable member whereby said slug is movably translated.

2. In combination, a microwave tuning cavity,
a tuning slug inserted within said microwave cavity and having a shape defining a polygon and adapted for translational movement,
a threaded member attached to one side of said slug,
a rotatable member having an internally threaded portion for accepting said threaded member, said rotatable member being restrained from translational movement,
means for restraining said slug from rotational movement only, and
means for rotating said rotatable member whereby said slug is movably translated.

3. In combination,
a tuning slug having a shape defining a polygon and adapted for translational movement,
a threaded member fixedly attached to one side of said slug whereby said threaded member is prevented from rotating,
a rotatable member cooperating with said threaded member and restrained against translational movement,
means for restraining said slug from rotational movement only,
means for rotating said rotatable member whereby said slug is movably translated, and
means for frictionally impeding said slug while being movably translated.

4. In combination,
a tuning slug having a substantially rectangular shape, a threaded member attached to one side of said slug,
a rotatable member having an internally threaded portion for accepting said threaded member, said rotatable member being restrained from translational movement,
means having substantially the same shape as said slug for accepting said slug whereby said slug is restrained from rotational movement,
said means having friction fingers contacting said slug for impeding translational movement of said slug, and
means for rotating said rotatable member whereby said slug is movably translated.

5. In combination,
a tuning slug having a shape defining a polygon and adapted for translational movement,
a threaded member attached to one side of said slug,
a rotatable member cooperating with said threaded member,
a substantially fixed walled member for supporting internally said tuning slug,
said threaded member and said rotatable member,
said walled member having at one end a shape similar to the shape of said slug for supporting said slug against rotational movement and at the other end an opening for said rotatable member,
said walled member having a collar portion for preventing translational movement of said rotatable member in one direction,
means cooperating with a flexible washer for preventing said rotatable member from translational movement in said other direction, and
means for rotating said rotatable member whereby said slug is movably translated.

References Cited by the Examiner

UNITED STATES PATENTS

| | | | |
|---|---|---|---|
| 1,275,855 | 8/1918 | Copping | 74—10.85 X |
| 2,591,644 | 4/1952 | Wadsworth | 74—10.85 X |
| 2,984,776 | 5/1961 | Barnes | 74—10.85 X |

MILTON KAUFMAN, *Primary Examiner.*

BROUGHTON G. DURHAM, *Examiner.*

P. W. SULLIVAN, T. W. SHEAR, *Assistant Examiners.*